United States Patent
Loering et al.

(10) Patent No.: US 8,339,576 B2
(45) Date of Patent: Dec. 25, 2012

(54) PROJECTION OBJECTIVE OF A MICROLITHOGRAPHIC PROJECTION EXPOSURE APPARATUS

(75) Inventors: Ulrich Loering, Schwaebisch Gmuend (DE); Vladimir Kamenov, Essingen (DE); Dirk Heinrich Ehm, Lauchheim (DE); Stefan-Wolfgang Schmidt, Aalen (DE); Moritz Becker, Stuttgart (DE); Andreas Wurmbrand, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 13/460,973

(22) Filed: May 1, 2012

(65) Prior Publication Data

US 2012/0281196 A1 Nov. 8, 2012

Related U.S. Application Data

(60) Provisional application No. 61/483,194, filed on May 6, 2011.

(30) Foreign Application Priority Data

May 6, 2011 (DE) .......................... 10 2011 075 465

(51) Int. Cl.
 *G03B 27/54* (2006.01)
 *G03B 27/42* (2006.01)

(52) U.S. Cl. .......................................... 355/67; 355/53

(58) Field of Classification Search .................... 355/53, 355/55, 67–71; 359/509, 620–626
See application file for complete search history.

(56) References Cited

U.S. PATENT DOCUMENTS

| 4,625,120 | A | 11/1986 | Caprari |
| 7,491,951 | B2 * | 2/2009 | Van Der Velden et al. ............. 250/492.2 |
| 7,719,661 | B2 * | 5/2010 | Nishikawa ...................... 355/67 |
| 2007/0146660 | A1 | 6/2007 | Van Der Velden et al. |
| 2009/0135386 | A1 | 5/2009 | Nishikawa |
| 2009/0141257 | A1 | 6/2009 | Nishikawa |
| 2009/0231707 | A1 | 9/2009 | Ehm et al. |
| 2011/0194091 | A1 | 8/2011 | Kwan et al. |

FOREIGN PATENT DOCUMENTS

| DE | 10 2006 044 591 | 4/2008 |
| DE | 10 2009 034 166 | 2/2010 |
| DE | 10 2009 012 091 | 3/2010 |
| DE | 10 2009 029 282.9 | 3/2011 |
| EP | 2 190 025 | 5/2010 |
| WO | WO 2008/034582 A2 | 3/2008 |
| WO | WO 2010/ 017952 | 2/2010 |
| WO | WO 2011/029761 | 3/2011 |

OTHER PUBLICATIONS

German Office Action, with English translation, for corresponding DE Appl No. 10 2011 075 465.2, dated Jan. 23, 2012.

* cited by examiner

*Primary Examiner* — Hung Henry Nguyen
(74) *Attorney, Agent, or Firm* — Fish & Richardson P.C.

(57) ABSTRACT

A projection lens of a projection exposure apparatus, for imaging a mask which can be positioned in an object plane onto a light-sensitive layer which can be positioned in an image plane, includes a housing, in which at least one optical element is arranged, at least one partial housing which is arranged within said housing and which at least regionally surrounds light passing from the object plane as far as the image plane during the operation of the projection lens, and a reflective structure, which reduces a light proportion which reaches the image plane after reflection at the at least one partial housing, by comparison with an analogous arrangement without said reflective structure.

20 Claims, 10 Drawing Sheets

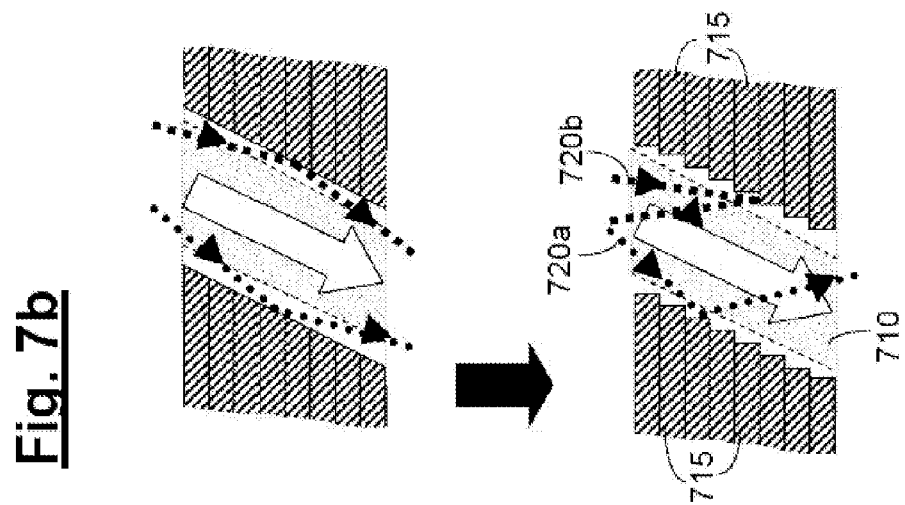
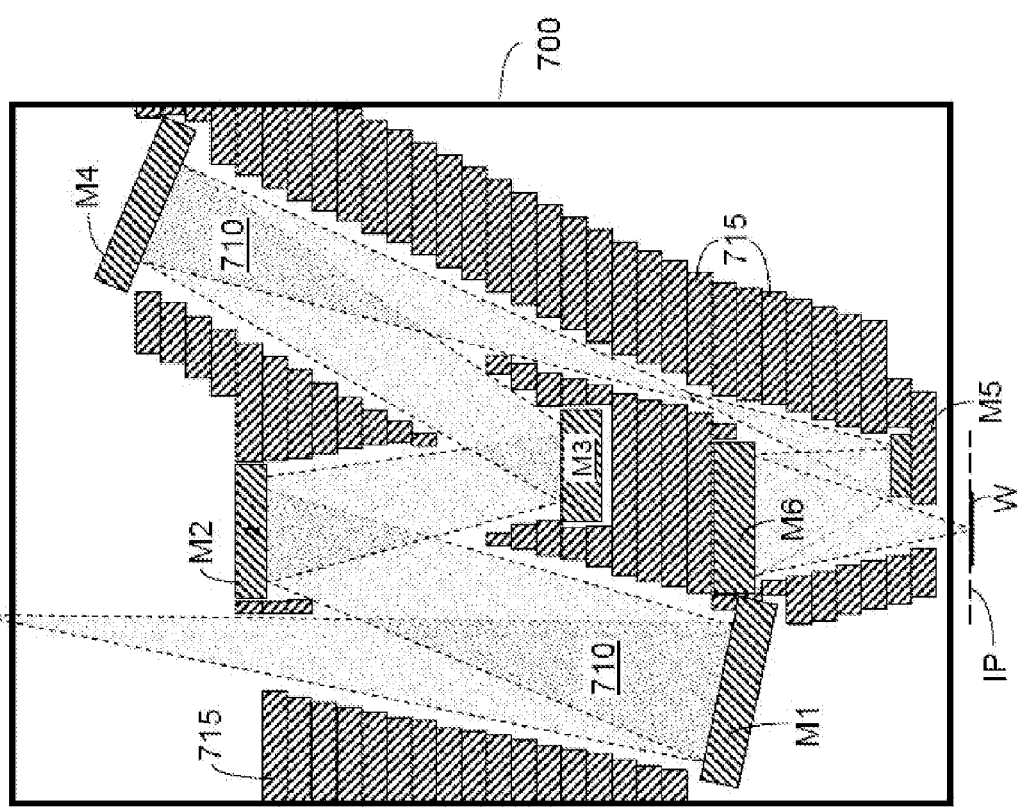

US 8,339,576 B2

PROJECTION OBJECTIVE OF A MICROLITHOGRAPHIC PROJECTION EXPOSURE APPARATUS

CROSS-REFERENCE TO RELATED APPLICATIONS

This application claims priority under 35 U.S.C. §119(e)(1) to U.S. Provisional Application No. 61/483,194, filed May 6, 2011. This application also claims benefit under 35 U.S.C. §119 to German Application No. 10 2011 075 465.2, filed May 6, 2011. The contents of both of these priority applications are hereby incorporated by reference in their entireties.

BACKGROUND

Field of the Disclosure

The present disclosure relates to a projection lens of a microlithographic projection exposure apparatus, in particular for EUV lithography.

Microlithography is used for producing microstructured components such as, for example, integrated circuits or LCDs. The microlithography process is carried out in a so-called projection exposure apparatus having an illumination device and a projection lens. In this case, the image of a mask (also referred to as a reticle) illuminated using the illumination device is projected by the projection lens onto a substrate (e.g., a silicon wafer) coated with a light-sensitive layer (a photoresist) and arranged in the image plane of the projection lens, in order to transfer the mask structure to the light-sensitive coating of the substrate.

In projection exposure apparatuses designed for the EUV range, i.e., at wavelengths of, e.g., approximately 13 nm or approximately 7 nm, owing to the lack of availability of suitable light-transmissive refractive materials, mirrors are used as optical components for the imaging process. Because the lifetime of the mirrors, and consequently of the projection exposure apparatus designed for operation under EUV conditions, is limited by contaminating particles or gases, in particular hydrocarbon compounds, operation of the projection exposure apparatus or of individual housing parts under vacuum conditions (e.g., at total pressures of $10^{-3}$ mbar or less) is desired.

In this case, the problem occurs in practice that the contaminants propagating in the system can adhere to the surfaces of the optical elements, which in turn results in impairment of the optical properties of the elements, that is to say in particular a loss of reflection of the mirrors.

WO 2008/034582 A2 and DE 10 2006 044 591 A1 disclose, inter alia, an optical arrangement, in particular a projection exposure apparatus for EUV lithography, which, for the purpose of reducing the adhering of contaminants in particular to reflective optical elements within an evacuated housing, has at least one further vacuum housing which surrounds the optical surface of the respective reflective optical element. The vacuum housing is assigned a contamination reducing unit which reduces the partial pressure of contaminating substances such as water and/or hydrocarbons at least in direct proximity to the optical surface. In this way, a type of "mini-environment" with a reduced number of contaminating particles is produced around the optical surface, such that fewer particles can attach on the optical surface. Furthermore, such a "mini-environment" also prevents the EUV radiation from striking elements of the projection exposure apparatus which tend toward outgassing, such as cables or sensors.

Conventionally, the wall of the partial housing forming the "mini-environment" described above is designed to be as smooth or as free of pores as possible, in order to avoid the deposition of contaminants on the wall itself. In this case, however, the further problem can occur that light proportions or partial rays of the light passing from the object plane as far as the image plane during the operation of the projection lens (said light is also designated here and hereinafter as "used light tube") can impinge on the inner wall of the partial housing whilst temporarily leaving the used light tube and can then pass after reflection at said inner wall to the wafer situated in the image plane, where they contribute (as it were as "extraneous light") to a reduction of the imaging contrast.

The effect described above can occur firstly for light proportions which are diffracted at the reticle and whose angle with respect to the optical system axis is outside the maximum numerical aperture of the system. This situation is illustrated in FIG. 9, in which the used light tube passing through a projection lens having six mirrors M1-M6, which are arranged within a partial housing 905 situated in an evacuated housing 900, from the object plane OP as far as the image plane IP is designated by "910", and wherein a partial ray which leaves said used light tube 910 and passes after reflection (which takes place in the example between the first and second mirrors M1, M2 relative to the optical beam path) as "extraneous light" to the wafer W is represented by the dotted line and is designated by "920".

The effect described can also occur for light proportions which is scattered at the mirror surfaces on account of the roughnesses present thereon and which likewise—as illustrated in FIG. 10 schematically for a partial ray 921 likewise depicted in dotted fashion—can impinge on the inner wall of the partial housing 905 whilst temporarily leaving the used light tube 910 (of which a partial ray 911 is depicted merely by way of example) and can pass after reflection at said inner wall to the wafer W situated in the image plane, where they likewise contribute as "extraneous light" to a reduction of the imaging contrast.

SUMMARY

Projection lenses for microlithographic projection exposure apparatus, in particular for EUV lithography, are disclosed which make it possible to reduce the adhering of contaminations whilst at the same time reducing impairment of the imaging contrast.

In general, in one aspect, the invention features a projection lens of a microlithographic projection exposure apparatus, in particular for EUV lithography, for imaging a mask which can be positioned in an object plane onto a light-sensitive layer which can be positioned in an image plane, the projection lens including:
 a housing, in which at least one optical element is arranged;
 at least one partial housing which is arranged within said housing and which at least regionally surrounds light passing from the object plane as far as the image plane during the operation of the projection lens; and
 a reflective structure, which reduces a light proportion which reaches the image plane after reflection at the at least one partial housing, by comparison with an analogous arrangement without said reflective structure.

Embodiments are based on the concept, in particular, of suppressing the proportion of specular reflections of the partial rays passing to the inner wall of the partial housing as a result of the influences described above using the design of the inner wall of the partial housing with a suitable reflective structure. In particular, what can be achieved (given suitable design of the reflective structure) is that firstly on account of light incidence that no longer takes place in a "grazing" manner but rather at a greater angle relative to the respective reflective surface or relative to the inner wall of the partial housing, the reflectivity for partial rays impinging on the reflective structure is reduced. Furthermore, for light proportions which nevertheless (i.e., despite the reduced reflectivity) are reflected at the reflective structure, the probability of said light proportions reaching the wafer by a direct optical route is reduced. In this case, the direction at least of a significant proportion of said reflected partial rays can be crucially changed to the effect that said partial rays have to be multiply reflected in order to reach the wafer, such that the intensity of the extraneous light impinging on the wafer is reduced as a result.

Without wishing to be bound by theory, the following criterion can serve for quantitatively describing the reduced reflectivity: in this case, the partial housing has an inner wall facing the light passing from the object plane as far as the image plane, wherein said inner wall has, at least for angles of incidence above a predefined threshold value (which can be, in particular, 60°), a reflectivity of less than 10% in a solid angle range of $-1° \leq \Omega \leq +1°$ around specular reflection, wherein $\Omega$ denotes the solid angle around specular reflection. The diagram in FIG. 11, which is merely schematic and not to scale, serves for elucidating the above variables, wherein "d" denotes the diameter of the irradiation spot, which, merely by way of example, can typically be 10 mm, and wherein $\Theta_i$ denotes the angle of incidence (which for specular reflection corresponds to the angle of reflection).

In some embodiments, the partial housing has an inner wall facing the light passing from the object plane as far as the image plane, wherein the reflective structure is formed on said inner wall. The reflective structure can have, in particular, a corrugation formed on the inner wall.

In certain embodiments, the corrugation has rounded surface structures. The corrugation can have pointed projections with rounded valleys arranged therebetween.

In some embodiments, the reflective structure has at least one diaphragm blade.

The reflective structure can have at least one reflective surface which forms an angle of at least 60°, more particularly at least 75°, and more particularly 90°, with the inner wall of the partial housing.

In general, in another aspect, the invention features a projection lens of a projection exposure apparatus, for imaging a mask which can be positioned in an object plane onto a light-sensitive layer which can be positioned in an image plane, the projection lens including:

a housing, in which at least one optical element is arranged; and at least one partial housing which is arranged within said housing and which at least regionally surrounds light passing from the object plane as far as the image plane during the operation of the projection lens;

wherein a structure having an arrangement of surfaces is provided on the inner wall of the partial housing wherein said surfaces are in each case arranged at an angle of at least 45° with respect to the light propagation direction of light impinging on the respective surface during the operation of the projection lens.

Each of said surfaces can be arranged at an angle of at least 60°, more particularly at least 75°, with respect to the light propagation direction of light impinging on the respective surface.

The at least one partial housing can be composed of a stack of plates. The plates can, in particular, each have an edge which faces the light passing from the object plane as far as the image plane and which is arranged at an angle of at least 45°, in particular at least 60°, more particularly at least 75°, and more particularly 90°, with respect to the light propagation direction.

In some embodiments, the partial housing has an antireflection coating at least regionally. Said antireflection coating can be provided as an alternative or else in addition to the above-described reflective structure (e.g., corrugation). Appropriate materials for the antireflection coating are, e.g., nickel-phosphorus (NiP) or the coating based on oxide ceramics which is sold by the company AHC Oberflächentechnik GmbH under the designation KEPLA-COAT®.

Such an antireflection coating can also serve for suppressing stray light or for preventing the propagation thereof, wherein such stray light can have merely by way of example a wavelength in the infrared range of 0.5-20 µm. This aspect of suppressing stray light is also of importance insofar as the above-described "mini-environment" for wavelengths in the infrared range typically has a comparatively high reflectivity, wherein IR radiation in the system results in additional thermal loads both on the optical elements such as mirrors, for example, and on reticle and wafer. When realizing the concept with the use of an antireflection coating, therefore, it is advantageously possible to combine the above-described and particularly notified suppression of specular reflections (of the EUV radiation) with the suppression of stray light (having wavelengths in the infrared range).

The suppression of stray light is desirable or necessary in the system also for EUV light and in particular in regions of the presence of materials which exhibit increased outgassing of contaminants under EUV irradiation. Preferably, therefore, the surface structuring of the partial housing is designed in such a way that stray light is kept away from such materials or surfaces. In particular, this applies, for instance, to adhesive joints and cable materials within the "mini-environment" or critical materials situated directly beyond openings of the "mini-environment" or outside the mini-environment.

In certain aspects, the invention furthermore relates to a microlithographic projection exposure apparatus and to a method for microlithographically producing microstructured components.

Further embodiments can be gathered from the description and the dependent claims.

BRIEF DESCRIPTION OF THE DRAWINGS

In the figures:

FIGS. 6-8 shows schematic illustrations of further exemplary embodiments;

DETAILED DESCRIPTION

Figure 1:
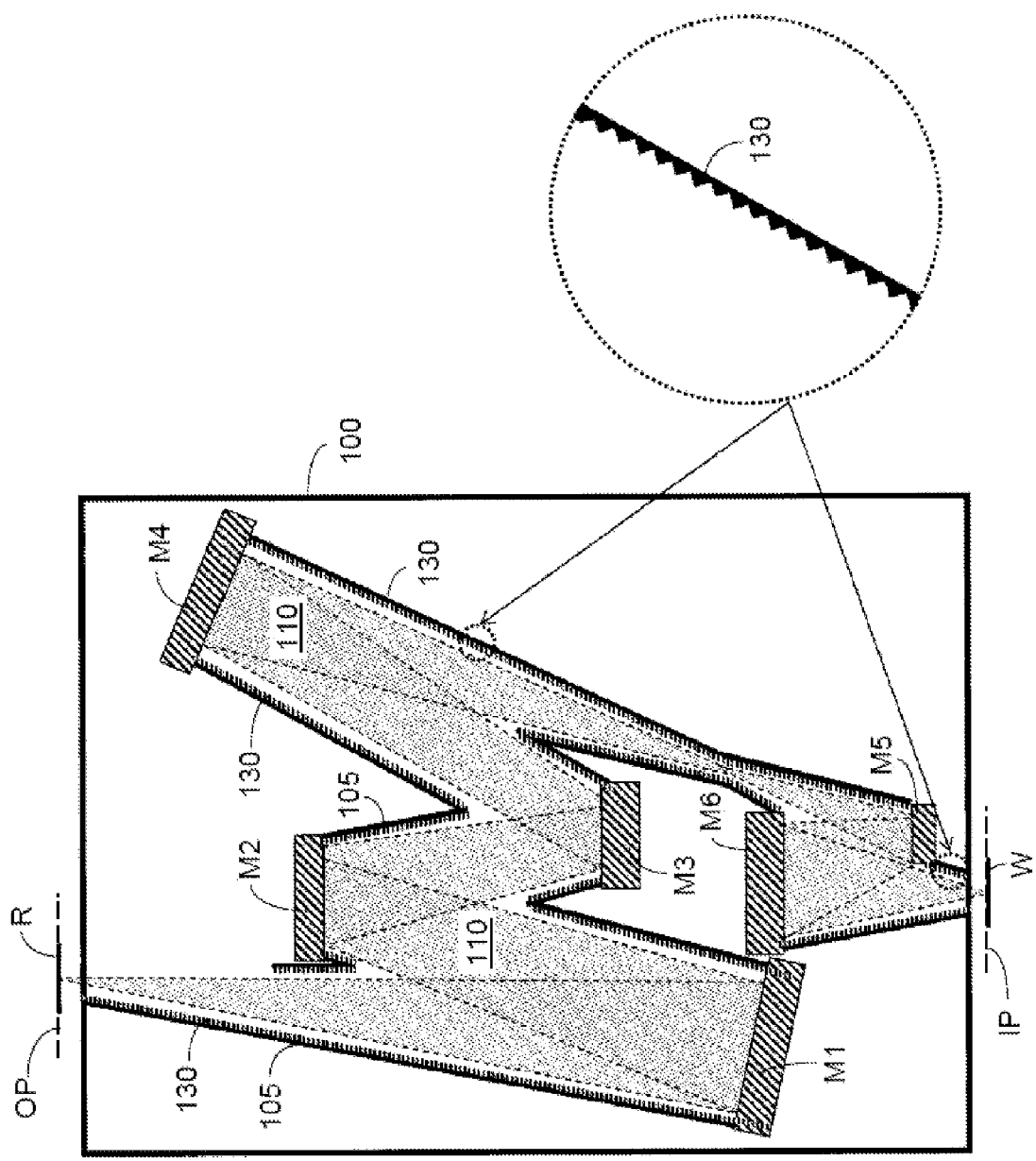
FIG. 1 shows an embodiment of a projection lens of a microlithographic projection exposure apparatus designed for operation in the EUV in schematic illustration.

FIG. 1 shows in schematic illustration of a projection lens of a lithographic projection exposure apparatus designed for operation in the EUV.

In the exemplary embodiment in FIG. 1, a projection lens has a total of six mirrors M1-M6, which are situated in a vacuum and for this purpose are enclosed by an outer housing 100. The projection lens can have, e.g., a magnification factor of 1:4. In accordance with FIG. 1, a beam 110 of rays (also designated hereinafter as "used light tube") proceeding from a reticle R passes after reflection at the mirrors M1-M6, for generating an image of the structure of the reticle R to be imaged, onto a wafer W.

Furthermore, in accordance with FIG. 1, a partial housing 105 is provided within the housing 100, said partial housing accommodating the mirrors M1-M6 and the beam 110 of rays in the form of a "mini-environment" previously known as such from WO 2008/034582 A2 and DE 10 2006 044 591 A1.

Within the meaning of the present application, a "mini-environment" is understood to be a structurally or spatially separated region which makes it possible to separately set the partial pressures of contaminants or other elements contained in said region (that is to say to create a dedicated "vacuum environment"). In this case, said spatially separated region can have openings in order to make it possible to set the partial pressures and/or to move or actuate optical elements. In the region of the mirrors M1-M6, therefore, it is possible to provide, in particular, certain gap distances between the partial housing 105 and the respective mirrors M1-M6, which make possible a movement or actuation of the mirrors M1-M6 and/or a permanent (purging) gas flow from the inner region of the partial housing 105 into the outer region of the partial housing 105, said outer region being under high-vacuum conditions.

The number of optical elements or mirrors illustrated here and in the further embodiments within the partial housing 105 is merely by way of example, such that the projection lens can also have more or fewer mirrors. Furthermore, instead of one partial housing 105, it is also possible to provide a plurality of partial housings (in particular, therefore, it is also possible for in each case only one mirror to be present within each partial housing).

The partial housing has an inner wall facing the light passing from the object plane OP as far as the image plane IP, wherein a reflective structure in the form of a corrugation 130 is formed on said inner wall.

Figure 3:
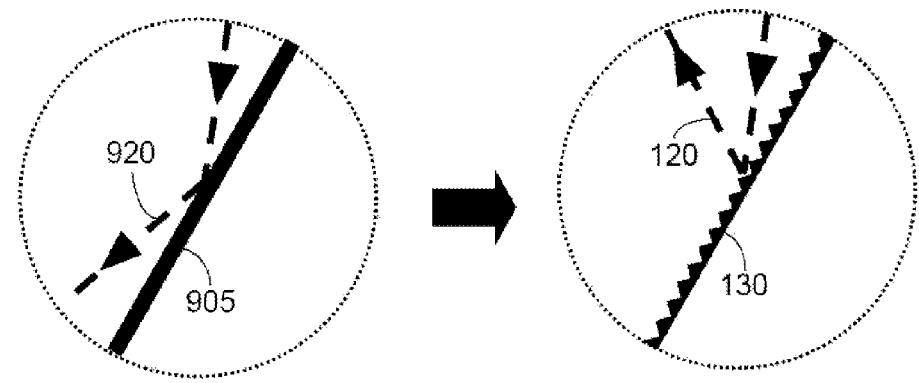
FIGS. 3-4 show schematic illustrations for elucidating the mode of action of the exemplary embodiments of FIGS. 1 and 2, respectively.

As can be seen from FIG. 1 and FIG. 3 (right-hand part), in the exemplary embodiment the edges of the corrugation 130 are inclined in sawtooth-like fashion in relation to the used light tube 110. The period of the corrugation 130 can be, merely by way of example, in the range of 0.5 mm to 10 mm, in particular in the range of 0.5 mm to 3 mm. Furthermore, the edges of the corrugation 130 can be electropolished in order at least substantially to avoid deposition of contaminants on the inner wall of the partial housing 105.

As explained hereinafter, the reflective structure or corrugation 130 has the effect that firstly on account of the light incidence that no longer takes place in a "grazing" fashion but rather at a greater angle relative to the respective reflective surface, the reflectivity for partial rays impinging on the corrugation 130 or inner wall is reduced, and that secondly for light proportions which nevertheless (i.e., despite the reduced reflectivity) are reflected at the corrugation 130, the probability of said light proportions reaching the wafer W by a direct optical route is reduced.

Figure 9:
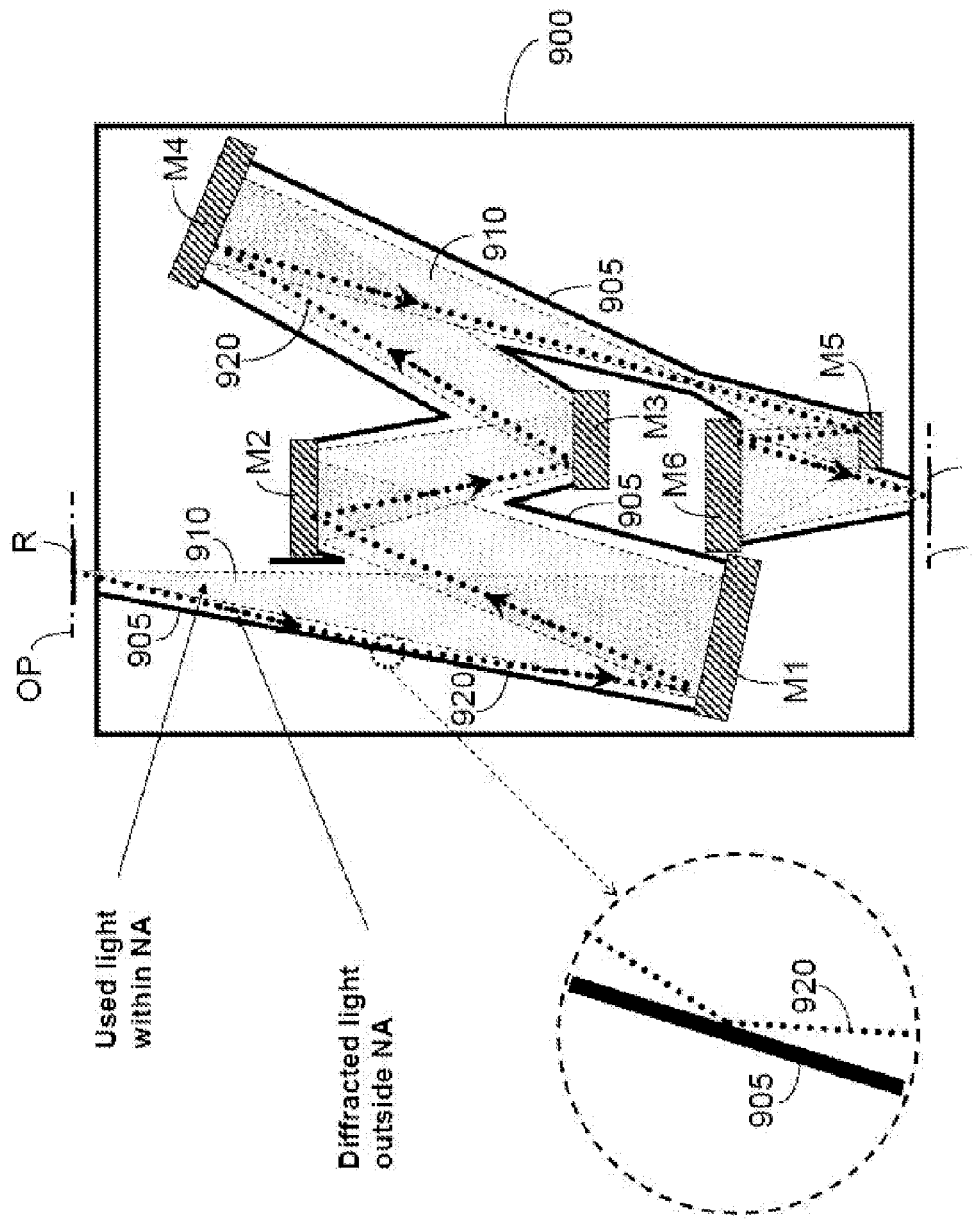
FIGS. 9-10 show schematic illustrations paths of stray light in embodiments of projection lenses.
Figure 10:
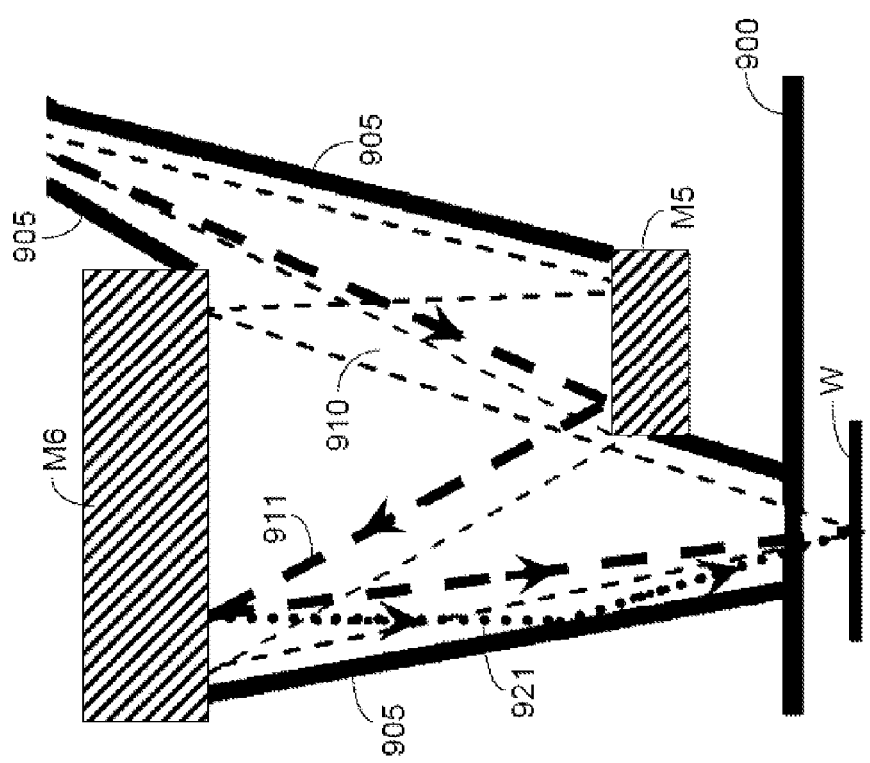
Figure 11:
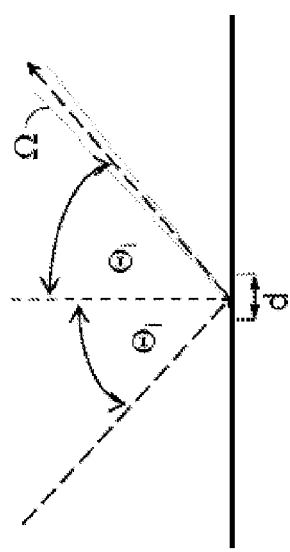
FIG. 11 shows a schematic diagram showing a relations between incident and reflected light at a surface.

In other words, as illustrated in FIG. 3, the reflective structure or corrugation 130 on the inner wall of the partial housing 105 suppresses the proportion of specular reflections of the partial rays passing in an undesirable manner to the inner wall of the partial housing 105 (as a result of the influences described with reference to FIGS. 9 and 10). Consequently, at least a significant proportion of said partial rays is no longer reflected in a grazing fashion or at a small angle at the inner wall back into the used light tube 110 (cf. FIG. 3 on the left), such that the probability of the reflected partial rays reaching the wafer W by a direct optical route is also reduced. As can be seen from FIG. 3 (right-hand part) upon reflection at the reflective structure or corrugation 130 on the inner wall of the partial housing 105, the direction of at least a significant proportion of said reflected partial rays is crucially changed to the effect that said partial rays have to be multiply reflected in order to reach the wafer W, such that the intensity of the extraneous light impinging on the wafer W is reduced as a result.

The corrugation 130 can be provided only regionally on the inner wall of the partial housing 105 or else on the entire inner wall of the partial housing 105.

In this case, a corrugation 130 provided between the reticle R and the first mirror M1 and/or between the first mirror M1 and the pupil plane (situated between the second mirror M2 and third mirror M3) primarily has the effect that light diffracted at the structures of the reticle R and impinging on the inner wall of the partial housing 105 is prevented from propagating to the wafer W. By contrast, a corrugation 130 situated comparatively near the wafer, and arranged, e.g., in the region between the mirrors M5 and M6, and between the mirror M6 and the wafer W, primarily has the effect that light scattered at the optically active surfaces of the mirrors M5, M6 near the wafer and impinging on the inner wall of the partial housing 105 is prevented from propagating to the wafer W.

Figure 5A:
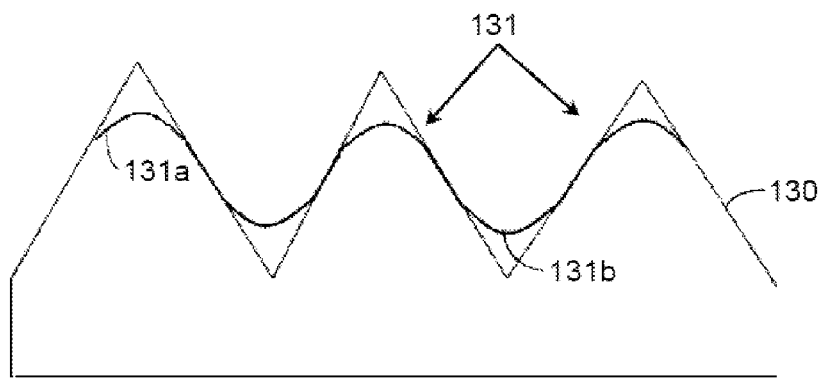
FIGS. 5a-b show schematic illustrations for elucidating possible modifications of the exemplary embodiment from FIG. 1.

In certain embodiments, a corrugation 131 in accordance with FIG. 5a can have rounded surface structures 131a, 131b in order to achieve improved cleaning for the purpose of avoiding contaminants and outgassing of the surface.

Figure 5B:
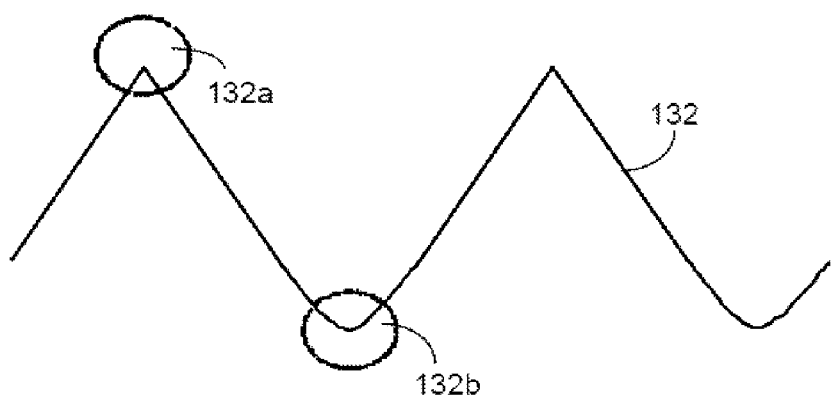

In accordance with FIG. 5b, as it were in a combination of the embodiments from FIG. 1 and FIG. 5a, a corrugation 132 can be designed with pointed projections 132a and rounded valleys 132b therebetween, in order (on account of the pointed projections 132a) to optimize the stray light proportion and (on account of the rounded valleys 132b) to obtain improved cleaning. In this case, the radii of curvature can respectively be adapted suitably from manufacturing standpoints.

Even though the corrugation 130 (or 131 or 132) in the exemplary embodiments described above is in each case represented in periodic fashion, other configurations are possible. In further exemplary embodiments, the corrugation can, for example, be designed differently in regions near mirrors than in regions far from mirrors (e.g., in the region centrally between two mirrors that are successive relative to the beam path), in order to take account of the respectively different requirements. In this case, the corrugation in regions near mirrors can, e.g., be designed in a targeted manner such that the emergence of stray light from the openings of the partial housing 105, which openings were mentioned in the introduction and are typically present in the region of the mirrors for instance for purposes of actuation or for realizing a purging gas flow, is minimized.

Figure 2:
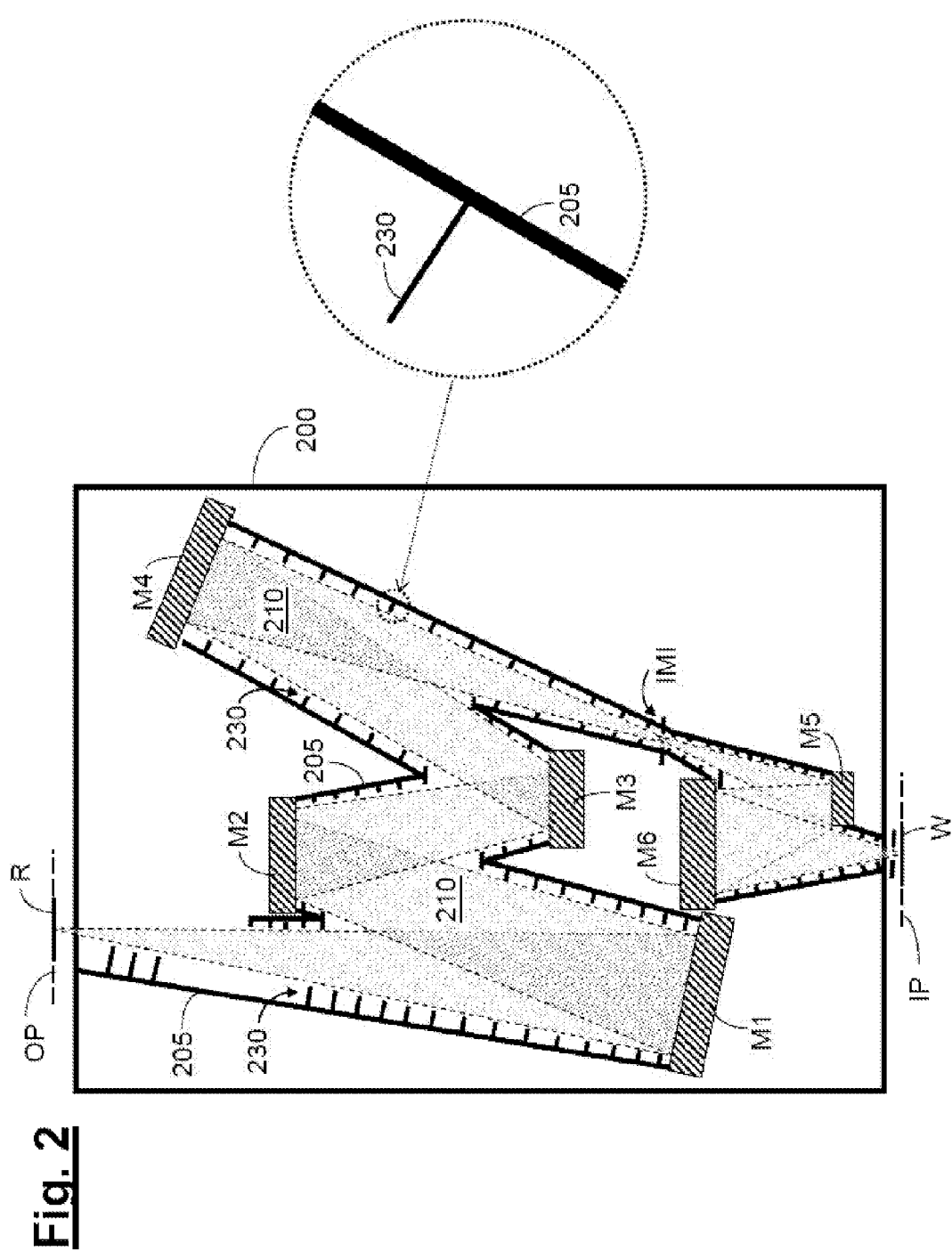
FIG. 2 shows a schematic illustration of a further exemplary embodiment of a projection lens of a microlithographic projection exposure apparatus designed for operation in the EUV.

FIG. 2 shows in schematic illustration a further exemplary embodiment, wherein, in comparison with the arrangement from FIG. 1, analogous or substantially functionally identical components are identified by reference numerals increased by "100".

The exemplary embodiment from FIG. 2 differs from that from FIG. 1 in that the partial housing 205 has an arrangement of diaphragm blades 230 on the inner wall facing the light passing from the object plane OP as far as the image plane IP.

As can be seen from FIG. 2, in the exemplary embodiment said diaphragm blades 230 are arranged perpendicularly to the inner wall of the partial housing 205 and are accordingly inclined to a comparatively great extent relative to the course of the used light tube 210. The distance between the diaphragm blades can be, for example, in the range of 1 cm to 5 cm. As can best be seen from the right-hand part of FIG. 2, the inner wall of the partial housing 205 can be electropolished in order to at least substantially avoid deposition of contaminants.

Figure 4:
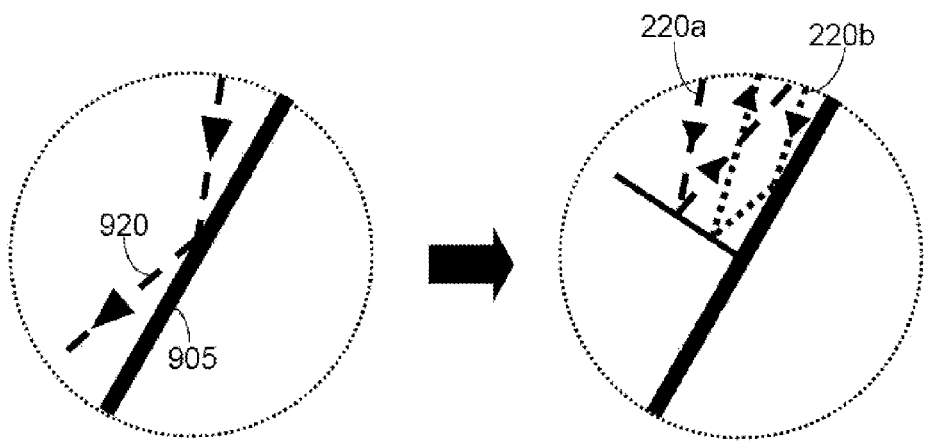

The mode of action of the diaphragm blades 230 can best be seen from FIG. 4.

Accordingly, some partial rays of the light passing through the projection lens on the way from the reticle R to the wafer W impinge on one of the diaphragm blades 230 before they reach the inner wall of the partial housing 205. The light incidence for such partial rays in accordance with FIG. 4 (right-hand part, dashed line, partial ray 220a) then no longer takes place in a grazing fashion, but rather virtually perpendicularly to the surface of the respective diaphragm blade 230, such that the reflectivity is comparatively small. Furthermore, a reflected ray is not reflected back into the used light tube 210 in a grazing fashion, but rather is greatly deflected, such that the probability of the rays thus reflected reaching the wafer W by way of the direct optical route is reduced.

Another portion of the partial rays of the light passing through the projection lens impinges on the inner wall of the partial housing 205 on the way from the reticle R to the wafer W with grazing incidence and is correspondingly reflected in a grazing fashion with relatively high reflectivity in the direction of the used light tube 210 in accordance with FIG. 4 (right-hand part, dotted line, partial ray 220b). With regard to such partial rays, the diaphragm blades 230 are dimensioned such that the partial rays reflected at the inner wall of the partial housing 205 impinge on a diaphragm blade 230. This (second) light incidence on the diaphragm blade 230 then does not take place in a grazing fashion, but rather virtually perpendicularly to the surface of the respective diaphragm blade 230, such that the reflectivity is comparatively small and the intensity is reduced further. The reflected partial ray is not reflected back again into the used light tube 210 in a grazing fashion, but rather is greatly deflected, such that the probability of the rays thus reflected reaching the wafer W by way of the direct optical route is reduced.

The diaphragm blades 230 described above can be provided only regionally on the inner wall of the partial housing 205 or else on the entire inner wall of the partial housing 205.

In this case, diaphragm blades 230 arranged between the reticle R and the first mirror M1 or between the first mirror M1 and the pupil plane situated between the second mirror M2 and third mirror M3 primarily have the effect that light diffracted at the structures of the reticle R and impinging on the inner wall of the partial housing 205 is prevented from propagating to the wafer W.

By contrast, diaphragm blades 230 situated comparatively near the wafer W and arranged, e.g., in the region between the mirrors M5 and M6 and between the mirror M6 and the wafer W primarily have the effect that the light which is scattered at the optically active surfaces of the mirrors M5, M6 near the wafer and which impinges on the inner wall of the partial housing 105 is prevented from propagating to the wafer W.

A preferred position for the arrangement of a diaphragm blade 230 or additional diaphragm, in particular, is in the region of an intermediate image IMI (e.g., situated between the fourth and fifth mirrors relative to the light propagation direction in the example of FIG. 2). Using a diaphragm blade 230 or additional diaphragm arranged at this position, comparatively long-range stray light proportions of the mirrors arranged upstream of such a diaphragm blade 230 in the light propagation direction (that is to say of the mirrors M1-M4 in the exemplary embodiment from FIG. 2) can be suppressed.

In some embodiments, the reflective structure is designed in such a way that stray light is kept away from surfaces which exhibit increased outgassing of contaminants under EUV irradiation. In order to prevent stray light from reaching such materials, in particular said openings of the partial housing can correspondingly be designed with a reflective structure. Elements to be protected in this way are, in particular, adhesive joints and cable materials within the "mini-environment" created by the partial housing and also critical materials situated directly behind the openings or outside the mini-environment or the partial housing forming the mini-environment.

A description is given below, with reference to FIGS. 6-8, of embodiments which are based on the fact that the partial housing forming the "mini-environment" is constructed (e.g., screwed together) from a stack of plates 615 lying horizontally (i.e., perpendicularly to the optical axis) one on top of another. In this case, e.g., each of said plates 615 can have a milled-out portion in the form of the envelope of the used light tube 610 (if appropriate plus tolerance allowances), as can be seen from FIG. 6.

Figure 6:
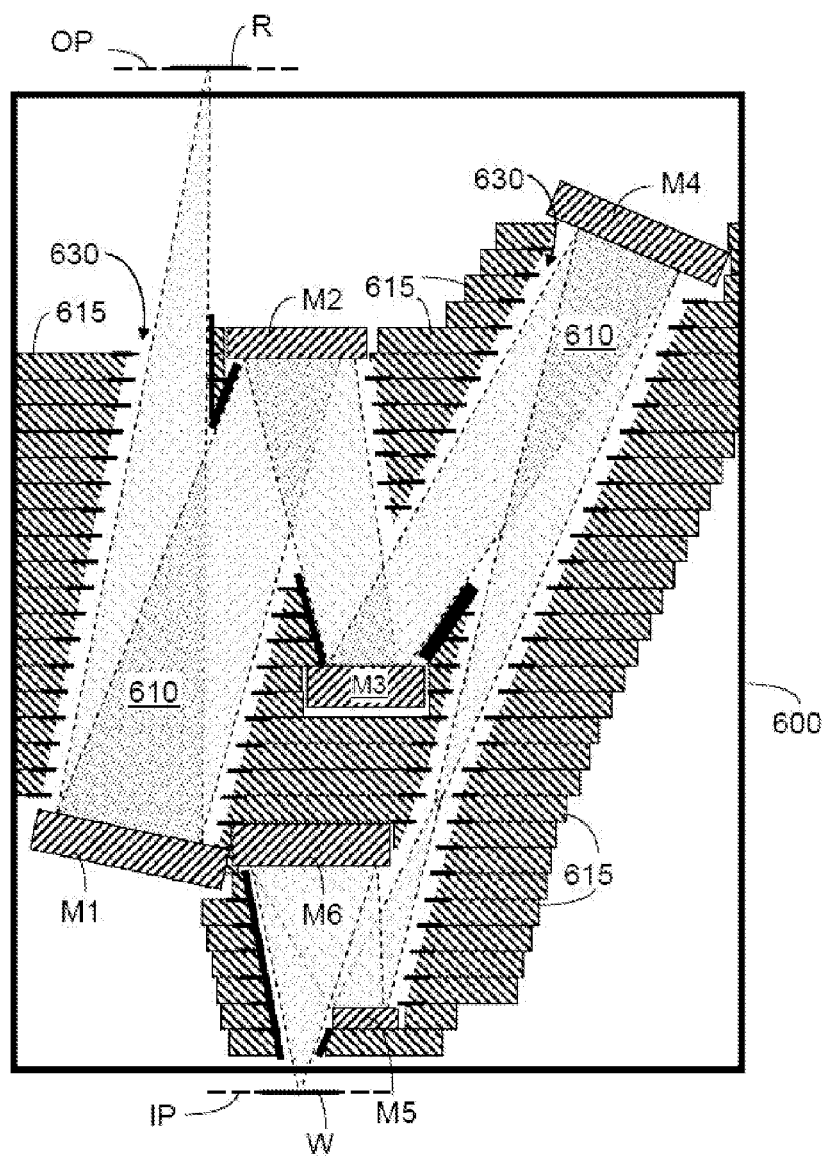

In FIG. 6, analogous or substantially functionally identical components in comparison with the arrangement from FIG. 1 are identified by reference numerals increased by "500".

As illustrated schematically in FIG. 6, in such a construction, diaphragm blades 630 like those described with reference to FIG. 2 can in each case be fitted between two plates 615 adjacent to one another (e.g., screwed to one another). With regard to advantages and further preferred embodiments, the above explanations in connection with FIG. 2 are correspondingly applicable.

FIG. 7 shows a further exemplary embodiment, in which in turn analogous or substantially functionally identical components in comparison with the arrangement from FIG. 6 are identified by reference numerals increased by "100". In the construction in FIG. 7, instead of the presence of diaphragm blades, cutouts in each of the plates 715 are no longer implemented parallel to the used light tube 710, but rather parallel to the respective normal to the plate (i.e., parallel to the optical system axis). Consequently, the angle of incidence of the partial rays impinging on the cutouts forming the inner wall of the "mini-environment" is increased, and the reflectivity decreases in comparison with grazing incidence. The partial rays, as illustrated schematically in FIG. 7b, lower part, for exemplary partial rays 720a, 720b, are predominantly no longer reflected back into the used light tube 710 in a grazing fashion, such that the probability of the partial rays thus reflected reaching the wafer W by way of the direct optical route is reduced. The direction is crucially changed, such that multiple reflections have to take place for the extraneous light to reach the wafer W. Consequently, the intensity of the extraneous light which can actually reach the wafer W is reduced.

Figure 8:
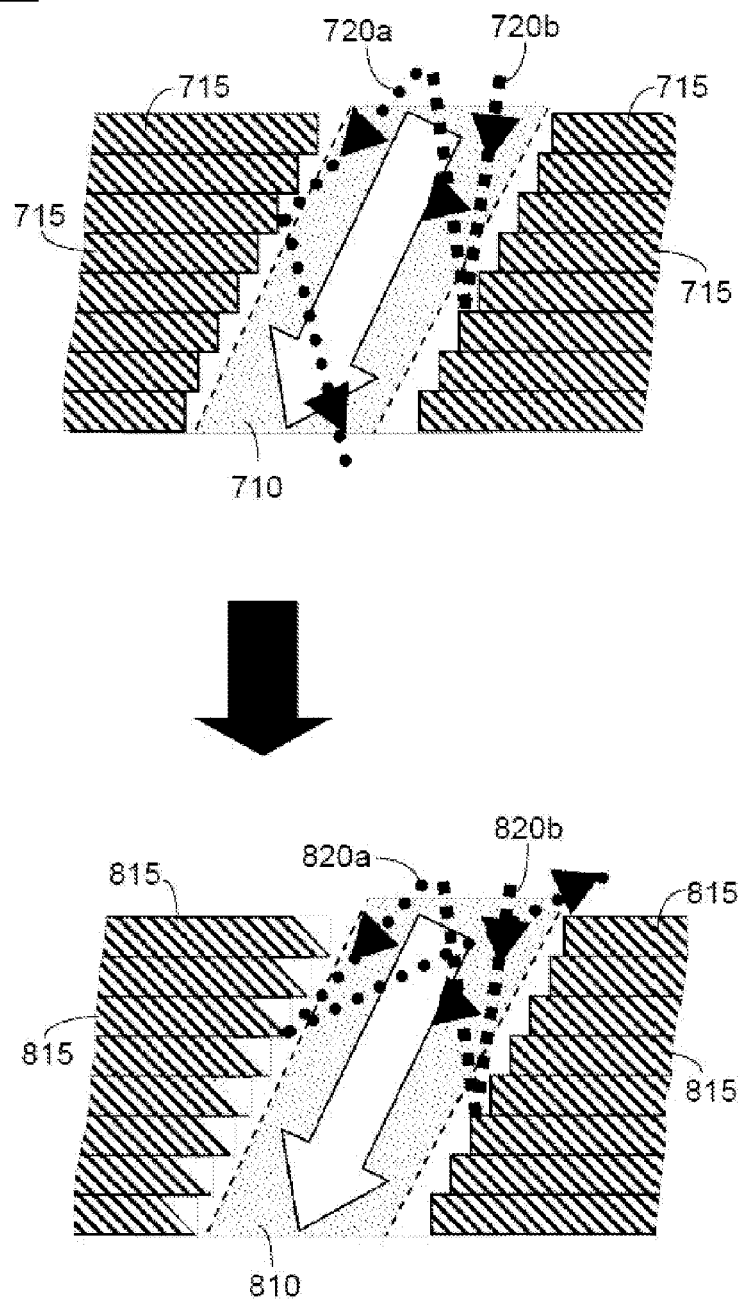

FIG. 8 shows a further embodiment, which differs from that from FIGS. 7a-b in that the edge gradient of the plates 815 is suitably adapted in the cutout. In this case, in turn analogous or substantially functionally identical components in comparison with the arrangement from FIG. 7 are identified by reference numerals increased by "100". In this case (in this respect analogously to the embodiment with diaphragm blades 230 or additional diaphragms from FIG. 2), in the exemplary embodiment the edge of the respective plate 815 is arranged substantially perpendicular to the used light tube 810. In further embodiments, the edge of the respective plate 815 can also be inclined to a relatively great extent in relation to the course of the used light tube 810, for example by at least 60°, more particularly at least 75°.

While certain embodiments are described, numerous variations and alternative embodiments are apparent to the person skilled in the art, e.g., through combination and/or exchange of features of individual embodiments. Accordingly, other embodiments are in the following claims.

What is claimed is:

1. A projection lens of a projection exposure apparatus, for imaging a mask which can be positioned in an object plane onto a light-sensitive layer which can be positioned in an image plane, the projection lens comprising:
    a housing, in which at least one optical element is arranged;
    at least one partial housing which is arranged within said housing and which at least regionally surrounds light passing from the object plane as far as the image plane during the operation of the projection lens; and
    a reflective structure, which reduces a light proportion which reaches the image plane after reflection at the at least one partial housing, by comparison with an analogous arrangement without said reflective structure.

2. The projection lens of claim 1, wherein the partial housing comprises an inner wall facing the light passing from the object plane as far as the image plane, wherein the reflective structure is formed on said inner wall.

3. The projection lens of claim 2, wherein the structure comprises at least one surface which forms an angle of at least 60° with the inner wall of the partial housing.

4. The projection lens of claim 1, wherein the partial housing comprises an inner wall facing the light passing from the object plane as far as the image plane, wherein said inner wall has, at least for angles of incidence above a predefined threshold value, a reflectivity of less than 10% in a solid angle range of $-1° \leq \Omega \leq +1°$ around specular reflection, wherein $\Omega$ denotes the solid angle around specular reflection.

5. The projection lens of claim 4, wherein said predefined threshold value is 60°.

6. The projection lens of claim 1, wherein the structure comprises a corrugation formed on the inner wall of the partial housing.

7. The projection lens of claim 6, wherein the corrugation comprises rounded surface structures.

8. The projection lens of claim 6, wherein the corrugation comprises pointed projections with rounded valleys arranged therebetween.

9. The projection lens of claim 1, wherein the structure comprises at least one diaphragm blade.

10. The projection lens of claim 1, wherein the at least one partial housing is composed of a stack of plates.

11. The projection lens of claim 10, wherein the plates each comprise an edge which faces the light passing from the object plane as far as the image plane and which is arranged at an angle of at least 45° with respect to the light propagation direction.

12. The projection lens of claim 1, wherein the partial housing comprises an antireflection coating at least regionally.

13. The projection lens of claim 1, wherein said projection lens is designed for an operating wavelength of less than 15 nm.

14. A microlithographic projection exposure apparatus, comprising an illumination device and the projection lens of claim 1.

15. A method for microlithographically producing microstructured components comprising the following steps:
    providing a substrate, to which a layer composed of a light-sensitive material is at least partly applied;
    providing a mask having structures to be imaged;
    providing a microlithographic projection exposure apparatus according to claim 14, and
    projecting at least part of the mask onto a region of the layer using the projection exposure apparatus.

16. A projection lens of a projection exposure apparatus, for imaging a mask which can be positioned in an object plane onto a light-sensitive layer which can be positioned in an image plane, the projection lens comprising:
    a housing, in which at least one optical element is arranged; and
    at least one partial housing which is arranged within said housing and which at least regionally surrounds light passing from the object plane as far as the image plane during the operation of the projection lens;
    wherein a structure having an arrangement of surfaces is provided on the inner wall of the partial housing wherein said surfaces are in each case arranged at an angle of at least 45° with respect to the light propagation direction of light impinging on the respective surface during the operation of the projection lens.

17. The projection lens of claim 16, wherein each of said surfaces is arranged at an angle of at least 60° with respect to the light propagation direction of light impinging on the respective surface.

18. The projection lens of claim 16, wherein the partial housing comprises an inner wall facing the light passing from the object plane as far as the image plane, wherein said inner wall has, at least for angles of incidence above a predefined threshold value, a reflectivity of less than 10% in a solid angle range of $-1° \leq \Omega \leq +1°$ around specular reflection, wherein $\Omega$ denotes the solid angle around specular reflection.

19. The projection lens of claim 18, wherein said predefined threshold value is 60°.

20. The projection lens of claim 16, wherein the structure comprises a corrugation formed on the inner wall of the partial housing.

* * * * *